United States Patent
Uchiyama

(10) Patent No.: US 8,013,373 B2
(45) Date of Patent: Sep. 6, 2011

(54) SEMICONDUCTOR DEVICE HAVING MOS-TRANSISTOR FORMED ON SEMICONDUCTOR SUBSTRATE AND METHOD FOR MANUFACTURING THEREOF

(75) Inventor: Hiroyuki Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 257 days.

(21) Appl. No.: 12/361,117

(22) Filed: Jan. 28, 2009

(65) Prior Publication Data
US 2009/0200593 A1 Aug. 13, 2009

(30) Foreign Application Priority Data
Jan. 30, 2008 (JP) ................................. 2008-019162

(51) Int. Cl.
*H01L 27/108* (2006.01)
(52) U.S. Cl. ........ 257/296; 438/424; 438/633; 438/631; 438/256; 438/253; 257/E27.084; 257/E29.02; 257/E21.546
(58) Field of Classification Search .................. 438/424, 438/633, 631, 256, 253, 279, 672; 257/296, 257/510, E27.084, E29.02, E21.546
See application file for complete search history.

(56) References Cited

U.S. PATENT DOCUMENTS

| | | | | |
|---|---|---|---|---|
| 4,546,538 A * | 10/1985 | Suzuki | ............ | 438/426 |
| 4,663,644 A * | 5/1987 | Shimizu | ............ | 257/331 |
| 5,477,071 A * | 12/1995 | Hamamoto et al. | .......... | 257/302 |
| 5,502,320 A * | 3/1996 | Yamada | ............ | 257/302 |
| 5,578,847 A * | 11/1996 | Aoki et al. | ................ | 257/296 |
| 5,610,419 A * | 3/1997 | Tanaka | ............ | 257/315 |
| 5,728,620 A * | 3/1998 | Park | ............ | 438/425 |
| 5,777,370 A * | 7/1998 | Omid-Zohoor et al. | ....... | 257/374 |
| 5,843,823 A * | 12/1998 | Wen | ................ | 438/275 |
| 5,889,302 A * | 3/1999 | Liu | ................ | 257/315 |
| 6,023,084 A * | 2/2000 | Tadaki et al. | ................. | 257/298 |
| 6,287,971 B1 * | 9/2001 | Park et al. | ................ | 438/689 |
| 6,291,298 B1 * | 9/2001 | Williams et al. | ............. | 438/270 |
| 6,429,080 B2 * | 8/2002 | Furukawa et al. | ............ | 438/286 |
| 6,429,494 B1 * | 8/2002 | Zimmermann | ............... | 257/391 |
| 6,674,120 B2 * | 1/2004 | Fujiwara | ...................... | 257/324 |
| 6,759,282 B2 * | 7/2004 | Campbell et al. | ............. | 438/149 |
| 6,844,578 B2 * | 1/2005 | Harada et al. | ................. | 257/278 |
| 6,872,994 B2 * | 3/2005 | Suk | ................ | 257/288 |
| 7,109,544 B2 * | 9/2006 | Schloesser et al. | ........... | 257/302 |
| 7,419,878 B2 * | 9/2008 | Williams et al. | ............. | 438/270 |
| 7,436,030 B2 * | 10/2008 | Yang et al. | .................... | 257/374 |

(Continued)

FOREIGN PATENT DOCUMENTS

JP 2006-261625 9/2006

(Continued)

*Primary Examiner* — N Drew Richards
*Assistant Examiner* — Ankush k Singal
(74) *Attorney, Agent, or Firm* — Young & Thompson

(57) ABSTRACT

A semiconductor device comprises MOS transistors sequentially arranged in the plane direction of a substrate, wherein a gate electrode and a wiring portion for connecting between the gate electrodes to each other are implanted into a layer that is lower than a surface of the substrate in which a diffusion layer has been formed. A first device isolation area with a STI structure for separating the diffusion layers that function as a source/drain area is formed on the surface of the substrate. A second device isolation area with the STI structure for separating channel areas of the MOS transistors adjacent to each other is formed in a layer that is lower than a layer that has the first device isolation area.

11 Claims, 9 Drawing Sheets

U.S. PATENT DOCUMENTS

| | | | |
|---|---|---|---|
| 7,439,153 B2* | 10/2008 | Tsuboi et al. | 438/404 |
| 7,504,295 B2* | 3/2009 | Lee et al. | 438/232 |
| 7,557,401 B2* | 7/2009 | Yonehama et al. | 257/314 |
| 7,576,389 B2* | 8/2009 | Tanaka | 257/330 |
| 7,749,846 B2* | 7/2010 | Seo et al. | 438/270 |
| 2002/0000592 A1* | 1/2002 | Fujiwara | 257/296 |
| 2003/0071297 A1* | 4/2003 | Hara et al. | 257/298 |
| 2003/0139027 A1* | 7/2003 | Ikeda et al. | 438/592 |
| 2004/0058481 A1* | 3/2004 | Xu et al. | 438/135 |
| 2004/0217434 A1* | 11/2004 | Lee et al. | 257/412 |
| 2005/0001257 A1* | 1/2005 | Schloesser et al. | 257/302 |
| 2005/0224852 A1* | 10/2005 | Cheng et al. | 257/296 |
| 2006/0270154 A1* | 11/2006 | Yamazaki | 438/253 |
| 2007/0026603 A1* | 2/2007 | Lee et al. | 438/250 |
| 2007/0049010 A1* | 3/2007 | Burgess et al. | 438/633 |
| 2007/0128784 A1* | 6/2007 | Campbell et al. | 438/199 |
| 2008/0035991 A1* | 2/2008 | Lee et al. | 257/331 |
| 2008/0061340 A1* | 3/2008 | Heineck et al. | 257/301 |
| 2008/0277713 A1* | 11/2008 | Maekawa | 257/316 |
| 2009/0179262 A1* | 7/2009 | Holz et al. | 257/331 |

FOREIGN PATENT DOCUMENTS

JP      2007-123551      5/2007

* cited by examiner

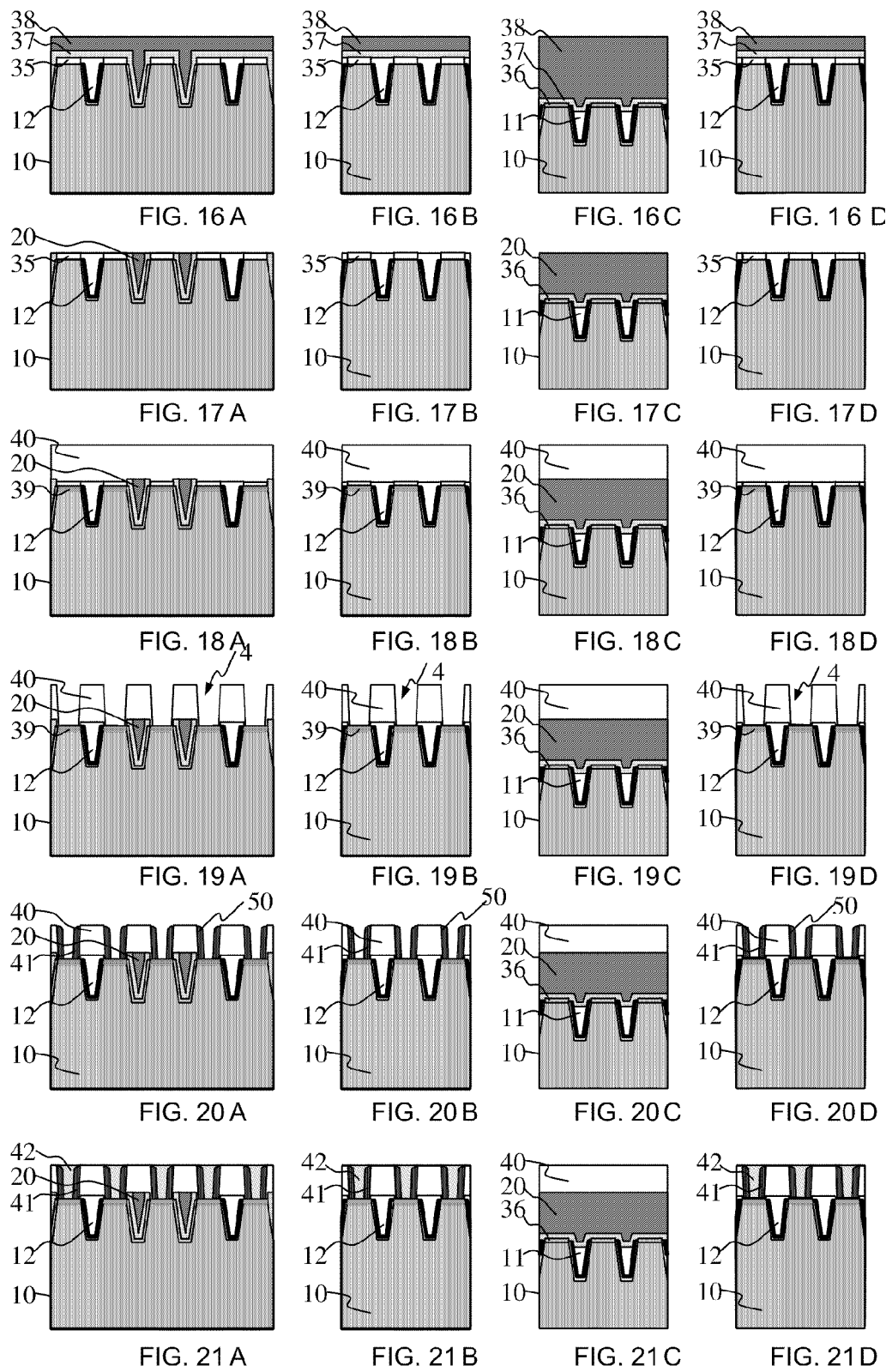

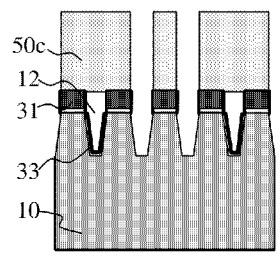 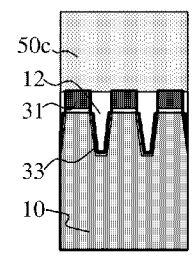 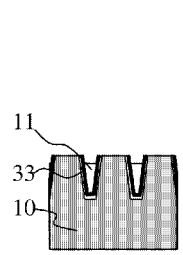 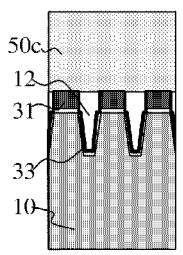
FIG. 27 A FIG. 27 B FIG. 27 C FIG. 27 D
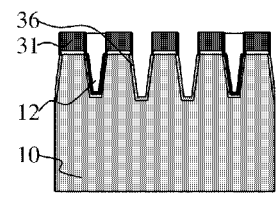 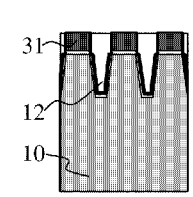 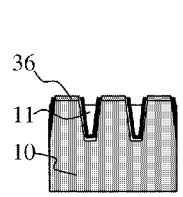 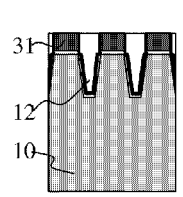
FIG. 28 A FIG. 28 B FIG. 28 C FIG. 28 D
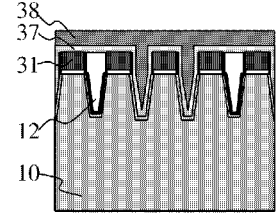 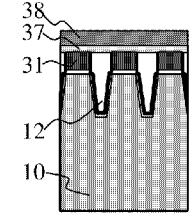 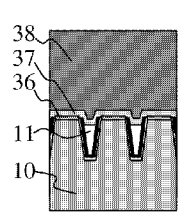 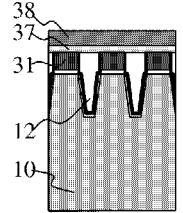
FIG. 29 A FIG. 29 B FIG. 29 C FIG. 29 D
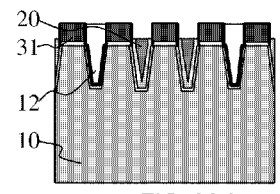 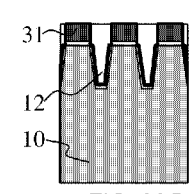 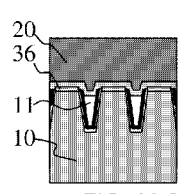 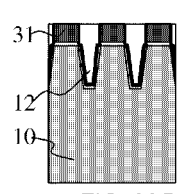
FIG. 30 A FIG. 30 B FIG. 30 C FIG. 30 D
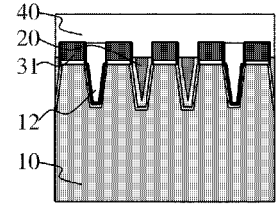 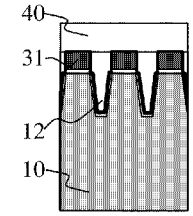 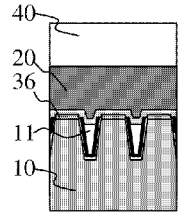 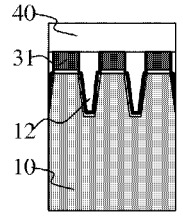
FIG. 31 A FIG. 31 B FIG. 31 C FIG. 31 D

SEMICONDUCTOR DEVICE HAVING MOS-TRANSISTOR FORMED ON SEMICONDUCTOR SUBSTRATE AND METHOD FOR MANUFACTURING THEREOF

This application is based upon and claims the benefit of priority from Japanese patent application No. 2008-19162, filed on Jan. 30, 2008, the disclosure of which is incorporated herein in its entirety by reference.

BACKGROUND OF THE INVENTION

1. Field of the Invention

The present invention relates to a method for manufacturing a semiconductor device having a MOS transistor formed on a semiconductor substrate to form a desired device and a structure thereof.

2. Description of Related Art

At present, in the case of forming a MOS transistor on a semiconductor substrate to form a desired device, there are problems and requirements such as following (1) to (3) as regards microfabrication of a semiconductor device.

(1) In the case of forming a high-performance MOS transistor, it is preferable that an LDD (Lightly Doped Drain) structure be applied to a source/drain area, or that a contact plug be formed on a gate electrode by self align in a subsequent manufacturing process. This requires a side wall insulating film provided on a side surface portion of the gate electrode and a cap insulating film to protect a top surface of the gate electrode. As a result, the total film thickness from the surface of a semiconductor substrate to the top surface of the gate electrode becomes twice as much as the film thickness of only the conductor portion of the gate electrode, or more, when the gate electrode is formed.

In a configuration like this, problems of processing occur due to processing a gate electrode with a large film thickness when a width of the gate electrode itself and a space between the gate electrode and a gate electrode adjacent thereto become smaller as the progress of mircofabrication. Specifically, there are problems in which the shape of the gate electrode worsens at the time of etching, the margin of an etching decreases when the opening portion of a self-align contact is formed, a void is generated at the time of implantation into a space portion between gate electrodes of an interlayer dielectric film, or the like. These are obstructions that inhibit making further progress towards microfabrication.

(2) On the other hand, a trench-gate transistor for suppressing a short channel effect in respond to microfabrication of a MOS transistor is known (see Japanese Patent Laid-Open No. 2007-123551). In a method for manufacturing the MOS transistor, after a device isolation area is formed on a semiconductor substrate, the semiconductor substrate (for example, a Si substrate) is etched to form a trench for a gate electrode. Because of this, it is effective for solving problem (1).

However, if the gate electrode cuts across the device isolation area, a conductive film for securing conduction of the gate electrode needs to be formed separately on the device isolation area because the trench is not formed on the device isolation area. The conductive film separately formed comes in contact with the top surface of the gate electrode that is filled in the trench portion so that a pattern of the gate electrode is formed. Because of this, there is a problem in which a conductor is likely to remain at the boundary portion of the inside and the outside of the device isolation area when the conductive film that has been separately formed is etched, resulting in the possibility of an electrical short circuit. Accordingly, an easier manufacturing method is required when the trench-gate transistor is used in order to progresses microfabrication.

(3) In general, a channel area and a diffusion layer area functioning as a source/drain area are formed by the same pattern in an active area in which a MOS transistor is formed. Thus, in the case of, for example, a DRAM memory cell, it is necessary to arrange rectangular patterns that have a high aspect ratio as an active area. Since a corner portion of the active area becomes rounded because of a characteristic of a lithography process at the time of the pattern formation, there are problems that a contact area with a contact plug decreases, or margin to alignment deviation cannot be sufficiently secured when the contact plug is formed. These are obstructions that inhibit making further progress toward microfabrication.

Additionally, Japanese Patent Laid-Open No. 2006-261625 is mentioned, for example, as a related art relative to the problem (2). In this patent document, after a polysilicon layer that is in contact with an impurity diffusion layer is formed, the device isolation area and further an interlayer dielectric film are formed to form a trench gate electrode. While this technique is effective for solving problem (2), problems (1) and (3) cannot be solved by applying this technique.

SUMMARY

The present invention seeks to solve one or more of problems (1), (2) and (3).

In one embodiment, there is provided a semiconductor device including MOS transistors sequentially arranged in a plane direction of a substrate and a method for manufacturing thereof, wherein gate electrodes and a wiring portion for connecting between the gate electrodes to each other are implanted into a layer that is lower than a substrate surface in which a diffusion layer is formed.

BRIEF DESCRIPTION OF THE DRAWINGS

The above features and advantages of the present invention will be more apparent from the following description of certain preferred embodiments taken in conjunction with the accompanying drawings, in which:

FIG. 7 shows sectional views showing the state of a memory cell structure after processing of first trenches has been completed when the memory cell shown in FIGS. 3 to 6 is manufactured;

FIG. 8 shows sectional views showing the state of a structure after a process of second trenches has been completed when the memory cell shown in FIGS. 3 to 6 is manufactured;

FIG. 9 shows sectional views showing a structure after oxidation inside the trenches when the memory cell shown in FIGS. 3 to 6 is manufactured;

FIG. 10 shows sectional views showing a structure after formation of a silicon nitride film inside the trenches when the memory cell shown in FIGS. 3 to 6 is manufactured;

FIG. 16 shows sectional views showing a structure after formation of a conductive film for word lines when the memory cell shown in FIGS. 3 to 6 is manufactured;

FIG. 17 shows sectional views showing a structure after formation of word lines when the memory cell shown in FIGS. 3 to 6 is manufactured;

FIG. 18 shows sectional views showing a structure after formation of an interlayer dielectric film on the word lines when the memory cell shown in FIGS. 3 to 6 is manufactured;

FIG. 19 shows sectional views showing a structure after formation of holes for contact plugs on the diffusion layers when the memory cell shown in FIGS. 3 to 6 is manufactured;

FIG. 20 shows sectional views showing a structure after formation of side walls inside the holes for forming contact plugs when the memory cell shown in FIGS. 3 to 6 is manufactured;

FIG. 21 shows sectional views showing a structure after formation of contact plugs when the memory cell shown in FIGS. 3 to 6 is manufactured;

FIG. 22 shows sectional views showing the state of a structure after processing of first trenches has been completed when a DRAM memory cell according to another exemplary embodiment is manufactured;

FIG. 23 shows sectional views showing the state of a structure after a processing of second trenches has been completed when the DRAM memory cell according to another exemplary embodiment is manufactured;

FIG. 24 shows sectional views showing a structure after formation of a silicon nitride film inside the trenches when the DRAM memory cell according to another exemplary embodiment is manufactured;

FIG. 25 shows sectional views showing a structure after implantation of a silicon oxide film into the trenches when the DRAM memory cell according to another exemplary embodiment is manufactured;

FIG. 26 shows sectional views showing a structure after planarization of layers that exist above the trench when the DRAM memory cell according to another exemplary embodiment is manufactured;

FIG. 27 shows sectional views showing a structure after formation of trenches for word lines when the DRAM memory cell according to another exemplary embodiment is manufactured;

FIG. 28 shows sectional views showing a structure after formation of a gate oxide/silicon film when the DRAM memory cell according to another exemplary embodiment is manufactured;

FIG. 29 shows sectional views showing a structure after formation of a conductive film for word lines when the DRAM memory cell according to another exemplary embodiment is manufactured;

FIG. 30 shows sectional views showing a structure after formation of word lines when the DRAM memory cell according to another exemplary embodiment is manufactured;

FIG. 31 shows sectional views showing a structure after formation of an interlayer dielectric film on the word lines when the DRAM memory cell according to another exemplary embodiment is manufactured;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

An example of the case where a DRAM memory cell is formed by applying the present invention is described.

Figure 1:
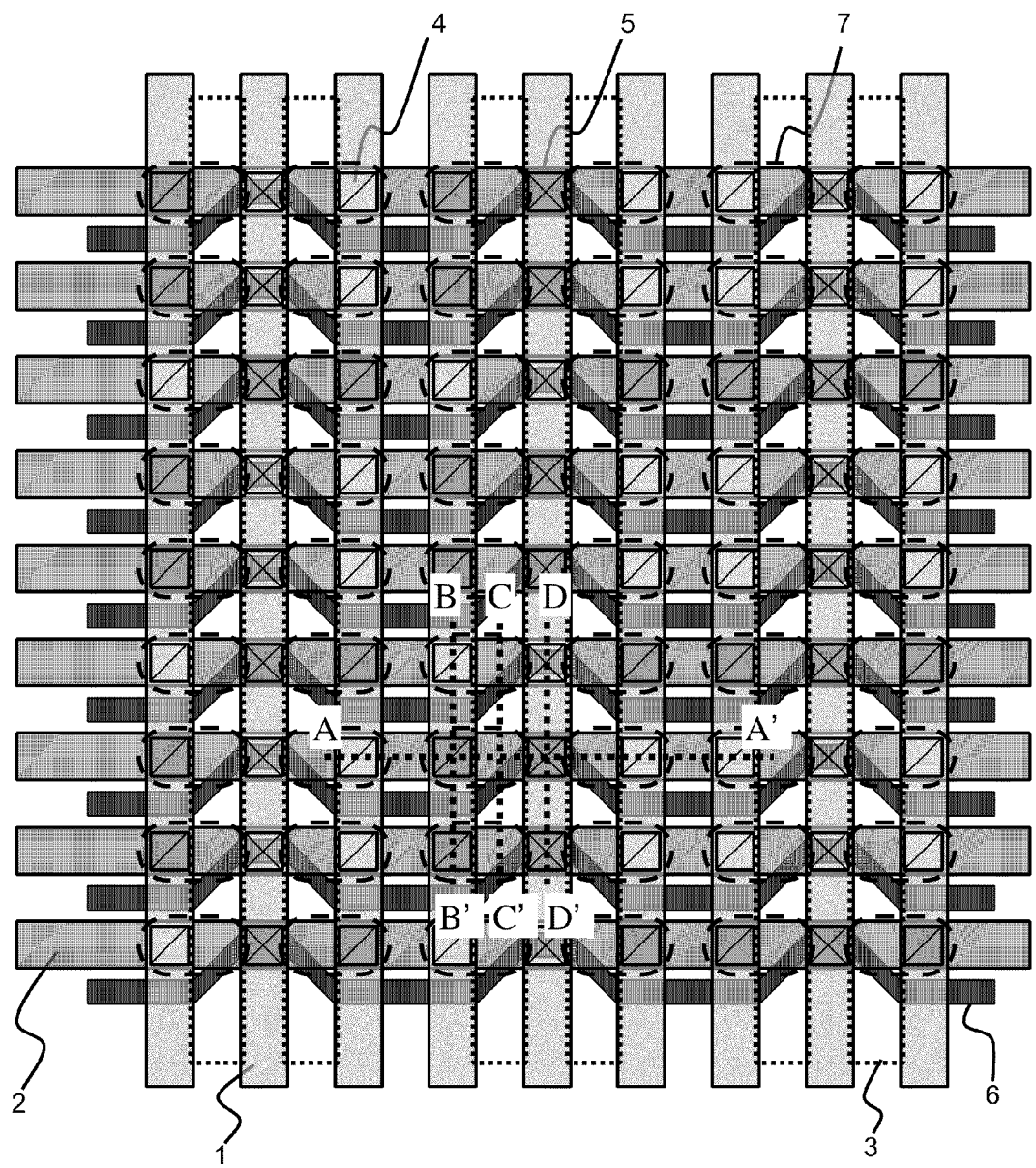
FIG. 1 is a plan view showing a layout of a DRAM memory cell in an exemplary embodiment.

FIG. 1 shows a plan view of a DRAM memory cell according to an exemplary embodiment. The DRAM memory cell of the exemplary embodiment employs an open bit line structure and has a memory cell area that ranges from a $6F^2$ size to a minimum processing size F in a process that is be used in the DRAM.

The DRAM memory cell of the exemplary embodiment includes an active area pattern in which two linear patterns of a first active field pattern 1 (a pattern that leaves a Si surface as it is) extending in a first direction and a second active field pattern 2 extending in a second direction perpendicular thereto are superimposed. Then, intersection points of active field patterns 1 and 2 are used as source/drain areas and trench gate electrodes are arranged between the intersection points in the second direction. As a result, the DRAM memory cell having MOS transistors arranged two-dimensionally is formed.

Word lines 3 are formed at space portions of active field pattern 1. Word lines 3 are formed in a straight line with gate electrodes of MOS transistors and a wiring portion for connecting between the gate electrodes to each other. Two word lines 3 are arranged per three space portions of active field pattern 1 in the exemplary embodiment. These word lines 3 are formed only with a trench formation pattern. That is, it is not necessary in the present invention that a conductive film for securing conduction on a device isolation area be separately be formed, which is necessary in the related art to form a trench-gate MOS transistor.

Further, a diffusion layer functioning as a source/drain area is formed at the intersection point of active field patterns 1 and 2. Contact pattern 4 for connecting to a storage electrode storing a charge or contact pattern 5 for connecting to a bit line is arranged on the diffusion layer.

Bit line 6 connected to contact pattern 5 is arranged in a bent shape so as to avoid contact pattern 4.

Capacitor pattern 7 for forming a capacitor including a storage electrode is arranged on contact pattern 4.

Necessary, a pattern for defining an ion implantation area, a pattern for forming a counter plate electrode of the capacitor and a through-hole pattern for connecting the metal wiring of an upper layer and wiring, or the like (not shown) are arranged so that a memory cell array of a DRAM is formed.

Figure 2:
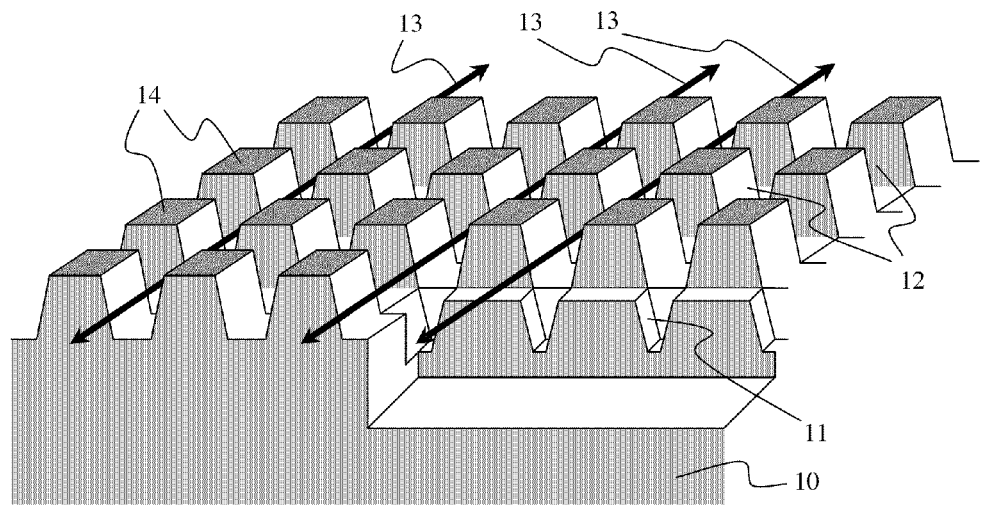
FIG. 2 is a bird's-eye schematic view showing a process state in which a top surface of a Si substrate is processed according to the exemplary embodiment.

FIG. 2 is a bird's-eye schematic view showing the state in which a surface of Si substrate 10 is processed by active field patterns 1 and 2. The remaining Si substrate surface is only an area of diffusion layer 14 of the MOS transistor. Arrows 13 show a position and a direction in which word lines 3 extend. Word line 3 is a gate electrode of a trench-gate MOS transistor in an area between the side surfaces of diffusion layers 14 of square patterns in a plane view. Other than that, word line 3 is a wiring portion for connecting between the gate electrodes to each other in one Si trench, although it is not shown. A Si trench without word line 3 is device isolation area 12 for electrically separating diffusion layers 14 adjacent to each other. Additionally, an intersection point of the space portions of active field patterns 1 and 2 is a trench that is deeper than the trench in which word line 3 is formed because a Si etching is performed twice. As a result, the intersection point is device isolation area 11 of a lower layer for separating channel areas of the MOS transistors that are adjacent to each other.

As described with the plan view of FIG. 1, the source/drain areas (diffusion layer 14) are separated by device isolation area 12 in the MOS transistors that are adjacent to each other arranged in an extending direction of first active field pattern 1 (a vertical direction of the drawing). Channel areas under a gate electrode between the source/drain areas are separated by device isolation area 11 of a layer that is lower than device isolation area 12. The MOS transistors adjacent to each other arranged in an extending direction of second active field pattern 2 (a lateral direction of the drawing) are separated by device isolation area 12 without word line 3.

Figure 3:
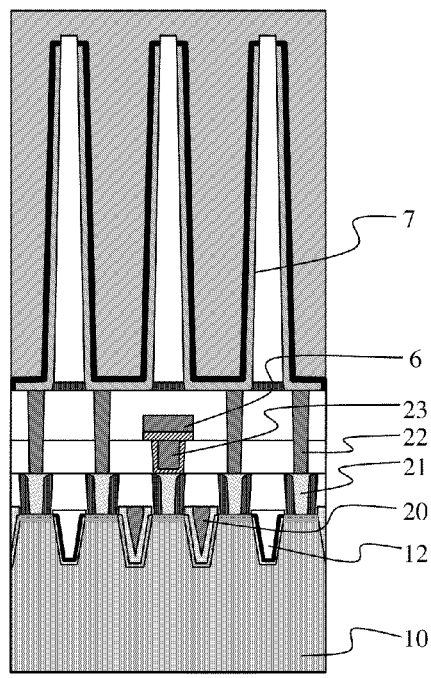
FIG. 3 is a sectional view showing an exemplary memory cell structure at a section A-A' in FIG. 1.
Figure 4:
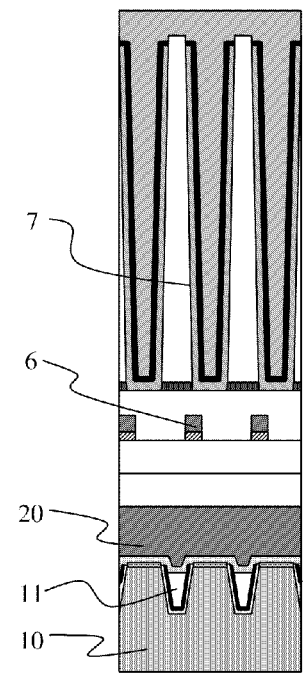
FIG. 4 is a sectional view showing an exemplary memory cell structure at a section B-B' in FIG. 1.
Figure 5:
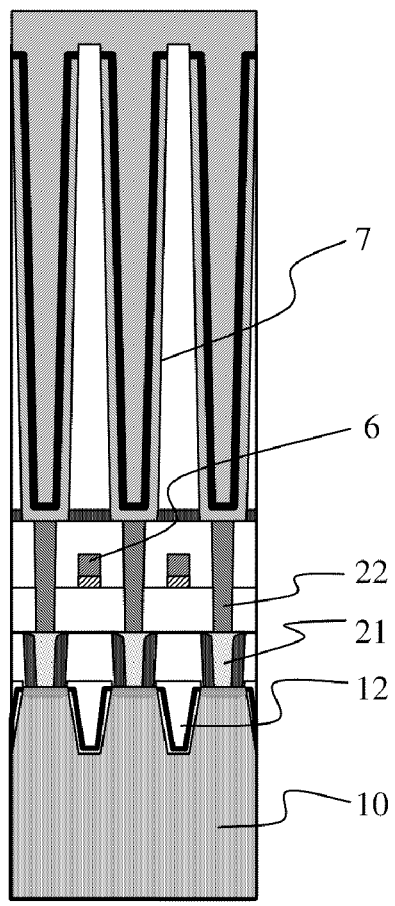
FIG. 5 is a sectional view showing an exemplary memory cell structure at a section C-C' in FIG. 1.
Figure 6:
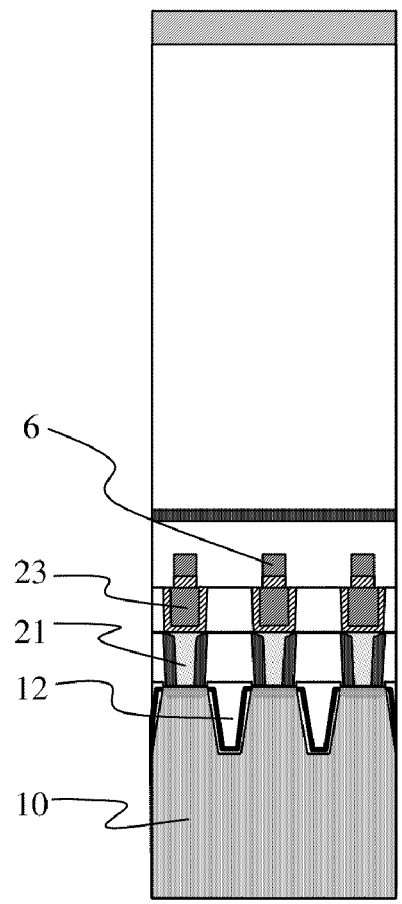
FIG. 6 is a sectional view showing an exemplary memory cell structure at a section D-D' in FIG. 1.

More specifically, FIG. 3 shows a section A-A' of FIG. 1, FIG. 4 shows a section C-C' of FIG. 1, FIG. 5 shows a section B-B' of FIG. 1 and FIG. 6 shows a section D-D' of FIG. 1. Referring to these drawings, a layer with the surface of Si substrate 10 includes trenches in which gate electrodes 20 used for word lines 3 are formed and device isolation areas 12 with a STI (Shallow Trench Isolation) structure for separating diffusion layers 14 that function as the source/drain areas of the MOS transistors adjacent to each other. Further, a layer that is lower than gate electrode 20 includes device isolation areas 11 with the STI structure for separating channel areas of the MOS transistors adjacent to each other. That is, a device isolation structure is a double layer structure of the layer for separating the diffusion layers of the MOS transistors adjacent to each other and the layer for separating the channel areas of the MOS transistors adjacent to each other.

Gate electrode 20 is implanted into a Si trench pattern similar to the STI structure of device isolation area 12 and a minimum amount thereof projects above the surface of Si substrate 10. Additionally, it is possible that the trench in which gate electrode 20 is formed is dug down to completely implant gate electrode 20 lower than the Si substrate surface, if there is a margin when forming of diffusion layer 14 is performed. Contact plugs 21 on diffusion layers 14 and contact plugs 22 for connecting storage electrodes are serially connected in a direction perpendicular to the surface of Si substrate 10. Thus, electrical transmission/reception of information is performed for capacitors (capacitor pattern 7) including storage electrodes. Bit lines 6 are connected by contact plugs 21 and 23 to diffusion layers 14 located between gate electrodes 20 except for diffusion layers 14 to which the capacitors are connected. A structure of layers that exists above contact plug 21 for connecting diffusion layers is almost similar to a structure of a conventionally known DRAM. A placement in a vertical direction of bit line 6 and the capacitor (capacitor pattern 7) or a structure of capacitor pattern 7 is not limited to the shown structure, and a CUB (Capacitor Under Bit Line) structure, a CROWN capacitor structure or the like considered in the conventionally known DRAM may be employed.

Description of a Manufacturing Method:

Next, a manufacturing method of the present invention is described with using sectional structural views of main steps shown in FIGS. 7 to 21. Reference characters (A), (B), (C), (D) in the respective FIGS. 7 to 21 correspond to the sections A-A', B-B', C-C', D-D' in FIG. 1 respectively.

As shown in FIG. 7, silicon oxide film ($SiO_2$) 30, silicon nitride film ($Si_3N_4$) 31 and photoresist film 50a are laminated on the surface of Si substrate 10 in the order named. After that, only photoresist film 50a remains over first active field pattern 1 by using a lithography technique. Then, Si substrate 10 is etched with the laminated films of silicon oxide film 30 and silicon nitride film 31 to form parallel first Si trenches 12a. Since Si trench 12a is a device isolation portion between the diffusion layers and a channel portion of the MOS transistor, a depth thereof is determined by ensuring the electrical characteristics of the device isolation portion and the necessary channel length. For example, the depth is set to be 200 nm. Photoresist film 50a is removed after first Si trenches 12a are formed.

Next, photoresist film 50b is deposited. After that, only photoresist film 50b remains over active field pattern 2 by using the lithography technique as shown in FIG. 8. Then, Si substrate 10 is etched with the laminated layers of silicon nitride film 31 and silicon oxide film 30 to form parallel second Si trenches.

As for the second Si trenches, trenches with partially different depths are formed on the surface of Si substrate 10. That is, Si trenches 12b that are mainly device isolation portions between the diffusion layers are formed in areas where first Si trenches 12a have not been formed. Deeper trenches 11a are formed by further etching in areas where first Si trenches 12a have been formed. The depth of Si trench 12b is the same as the depth of first Si trench 12a or deeper for ensuring the electrical characteristics of the device isolation portion. The exemplary embodiment employs the same depth of 200 nm.

As further shown in FIG. 9, photoresist film 50b is removed. After that, the Si surface of the inner walls of Si trenches 12a, 12b and 11a is washed with a chemical solution such as a diluted hydrofluoric acid and further oxidized by a thermal oxidation method. Because of this, the thickness of formed silicon oxide film 32 is, for example, 8 nm taking into consideration the need for stress relaxation and prevention of interface failure.

As shown in FIG. 10, silicon nitride film 33 is formed on the top surface of the substrate including the insides of Si trenches 12a, 12b and 11a by, for example, a CVD method. A thickness of silicon nitride film 33 is, for example, 10 nm taking into consideration the need to prevent reoxidation of a Si interface and diffusion of impurities.

Figure 11:
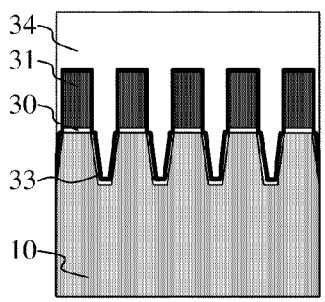
FIG. 11 shows sectional views showing a structure after implantation of a silicon oxide film into the trenches when the memory cell shown in FIGS. 3 to 6 is manufactured.
Figure 11:
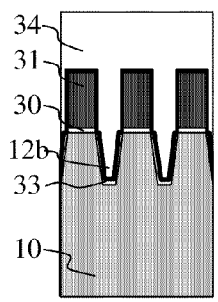
Figure 11:
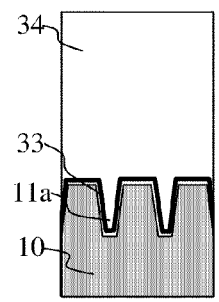
Figure 11:
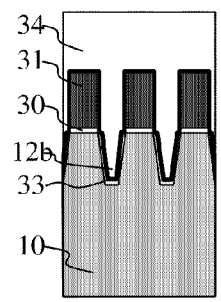

Next, as shown in FIG. 11, silicon oxide film 34 (insulating film) is formed by, for example, an HDP-CVD (High Density Plasma CVD) method so as to bury Si trenches 12a, 12b and 11a (see FIG. 10) that have been formed. The thickness of silicon oxide film 34 is about 1.0 to 2.0 times greater than the trench width for burying Si trenches 12a, 12b and 11a.

Figure 12:
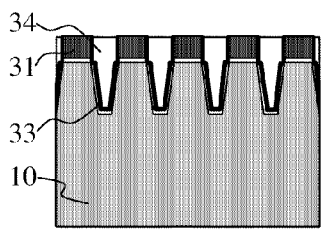
FIG. 12 shows sectional views showing a structure after planarization of layers that exist above the trenches when the memory cell shown in FIGS. 3 to 6 is manufactured.
Figure 12:
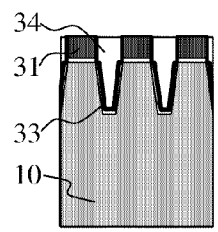
Figure 12:
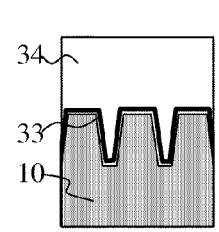
Figure 12:
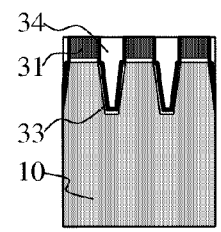

After that, as shown in FIG. 12, silicon oxide film 34 is abraded by, for example, a CMP (Chemical Mechanical Polishing) method for exposing silicon nitride film 31.

Figure 13:
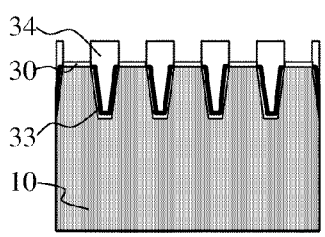
FIG. 13 shows sectional views showing a structure after removal of a silicon nitride film on a diffusion layer when the memory cell shown in FIGS. 3 to 6 is manufactured.
Figure 13:
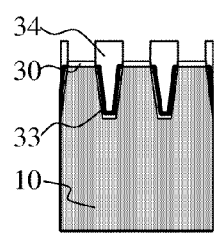
Figure 13:
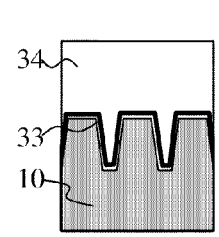
Figure 13:
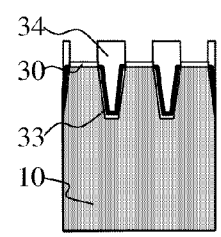

Then, exposed silicon nitride film 31 is removed as shown in FIG. 13 by, for example, wet etching using thermal phosphoric acid.

Figure 14:
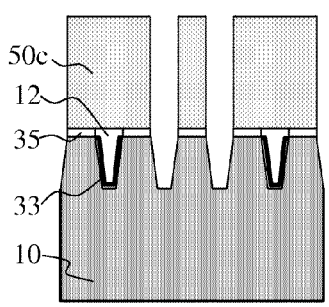
FIG. 14 shows sectional views showing a structure after formation of trenches for word lines when the memory cell shown in FIGS. 3 to 6 is manufactured.
Figure 14:
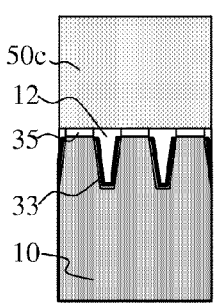
Figure 14:
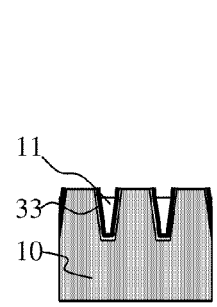
Figure 14:
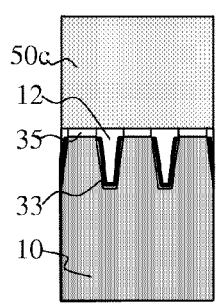

Next, the top surfaces of silicon oxide films 30 and 34 are removed by hydrofluoric acid-based wet etching. After that, as shown in FIG. 14, silicon oxide film 35 is formed on the exposed Si surface by the thermal oxidation method. After photoresist film 50c is applied, only trench portions into which gate electrodes 20 (see FIG. 3) of the MOS transistors are implanted are opened by the lithography technique. Then, only silicon oxide film 34, silicon nitride film 33 and silicon oxide film 32 are removed inside the opened trenches by using a wet etching or a dry etching.

Figure 15:
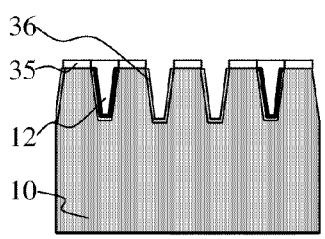
FIG. 15 shows sectional views showing a structure after formation of a gate oxide/silicon film when the memory cell shown in FIGS. 3 to 6 is manufactured.
Figure 15:
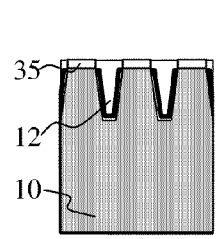
Figure 15:
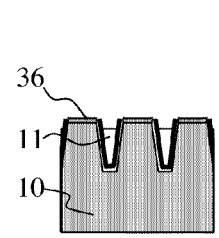
Figure 15:
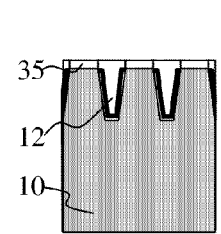

Next, as shown in FIG. 15, the exposed Si surface is washed after photoresist film 50c is removed. Then, gate oxide/silicon film 36 is formed on the Si surface by, for example, the thermal oxidation method.

As shown in FIG. 16, poly-Si film 37 having an impurity such as phosphorus or boron implanted and tungsten (W) film 38 are formed so as to bury the opened trenches. In this case, a tungsten nitride (WN) film or a tungsten silicide (WSi) film may be formed between poly-Si film 37 and tungsten film 38 for preventing a reaction and for reducing resistance at an interface between them.

After that, tungsten film 38 and poly-Si film 37 that have been formed above the surface of Si substrate 10 are abraded and removed by, for example, the CMP method so that tungsten film 38 and poly-Si film 37 which are made of conductive films remain only in the trenches as shown in FIG. 17. Because of this, gate electrodes 20 of word lines are formed.

As further shown in FIG. 18, interlayer dielectric film (oxide film) 40 is formed by, for example, the CVD method and contact patterns 4 are opened in interlayer dielectric film 40 by using the lithography technique and an anisotropic dry etching technique as shown in FIG. 19.

Then, film formation by the CVD method and an etch-back process according to the dry etching technique are performed for ensuring an insulation between contact plug 21 (see FIG. 3) and gate electrode 20. Because of this, side walls 50 of a silicon nitride film are formed on the side walls of interlayer dielectric film 40 as shown in FIG. 20.

Further, a poly-Si film having an impurity implanted is formed by the CVD method and an etch-back process is performed by using the dry etching technique. Because of this, contact plugs 21 for connecting diffusion layers 14 and elements over interlayer dielectric film 40 are formed in the holes of contact patterns 4, as shown in FIG. 21.

It is obvious that impurity implantation and thermal processing that are necessary for forming the MOS transistors are properly performed, although they are not shown. The MOS transistor to be formed can be applied to either an N-channel (Nch) type or a P-channel (Pch) type.

While steps after the above steps are not shown, similarly to the conventional DRAM, contact plugs 22 for connecting to the storage electrodes, capacitors including the storage electrodes (capacitor pattern 7), bit line 6, contact plugs 23 for connecting to bit lines 6, and the like are formed so that the DRAM memory cell is completed (see FIGS. 3 to 6). A wiring layer is further formed over this memory cell to complete a DRAM.

Another Exemplary Embodiment

Next, a manufacturing method according to another exemplary embodiment is described with using sectional structural views of the main steps shown in FIGS. 22 to 36. Reference characters (A), (B), (C), (D) in respective FIGS. 22 to 36 correspond to sections A-A', B-B', C-C', D-D' in FIG. 1 respectively.

According to another exemplary embodiment, silicon oxide film ($SiO_2$) 30, silicon nitride film 31 and photoresist film 50a are initially laminated on the surface of Si substrate 10 in the order named, as shown in FIG. 22. After that, photoresist film 50a is left on only the first active field pattern 1 by using a lithography technique. Then, Si substrate 10 is etched with the laminated films of silicon oxide film 30 and silicon nitride film 31 to form parallel first Si trenches 12a. Since Si trench 12a is a device isolation portion between the diffusion layers and a channel portion of the MOS transistor, the depth thereof is determined by ensuring the electrical characteristics of the device isolation portion and the necessary channel length. For example, the depth is set to be 200 nm. Photoresist film 50a is removed after first Si trenches 12a are formed.

Next, photoresist film 50b is deposited. After that, photoresist film 50b is left on only the active field pattern 2 by using the lithography technique as shown in FIG. 23. Then, Si substrate 10 is etched with the laminated layers of silicon nitride film 31 and silicon oxide film 30 to form parallel second Si trenches.

As for the second Si trenches, trenches with partially different depths are formed on the surface of Si substrate 10. That is, Si trenches 12b that are mainly device isolation portions between the diffusion layers are formed in areas where first Si trenches 12a have not been formed. Deeper trenches 11a are formed by further etching in areas where first Si trenches 12a have been formed. The depth of Si trench 12b is the same as the depth of first Si trench 12a or deeper for ensuring the electrical characteristics of the device isolation portion. The exemplary embodiment employs the same depth of 200 nm.

As further shown in FIG. 24, photoresist film 50b is removed. After that, the Si surface of the inner walls of Si trenches 12a, 12b and 11a is washed with a chemical solution such as diluted hydrofluoric acid and further oxidized by a thermal oxidation method. Because of this, the thickness of formed silicon oxide film 32 is, for example, 8 nm taking into consideration the need for stress relaxation and prevention of interface failure. Then, silicon nitride film 33 is formed on the top surface of the substrate including insides of Si trenches 12a, 12b and 11a by, for example, a CVD method. The thickness of silicon nitride film 33 is, for example, 10 nm taking into consideration the need to prevent reoxidation of a Si interface and diffusion of impurities.

Next, as shown in FIG. 25, silicon oxide film 34 (insulating film) is formed by, for example, an HDP-CVD method so as to bury formed Si trenches 12a, 12b and 11a (see FIG. 24). The thickness of silicon oxide film 34 is about 1.0 to 2.0 times greater than the trench width for burying Si trenches 12a, 12b and 11a.

After that, as shown in FIG. 26, silicon oxide film 34 is abraded by, for example, a CMP method for exposing silicon nitride film 31.

In the exemplary embodiment, photoresist film 50c is applied with the remaining silicon nitride film 31 after a processing of the CMP is completed, as shown in FIG. 27. After that, only the trench portions into which gate electrodes 20 (not shown in FIG. 27) of the MOS transistors are implanted are opened by using the lithography technique. Then, silicon oxide film 34, silicon nitride film 33 and silicon oxide film 32 are removed only the inside of the opened trenches by using a wet etching or by using a dry etching.

As shown in FIG. 28, the exposed Si surface is washed after photoresist film 50c is removed. Then, gate oxide/silicon film 36 is formed on the Si surface by, for example, the thermal oxidation method.

Next, as shown in FIG. 29, poly-Si film 37 and tungsten film 38 are formed so as to bury the opened trenches. In this case, a tungsten nitride film or a tungsten silicide film may be formed between poly-Si film 37 and tungsten film 38 for preventing a reaction and for reducing resistance at an interface between them.

As further shown in FIG. 30, tungsten film 38 and poly-Si film 37 that were formed on the surface of Si substrate 10 are removed by, for example, the CMP method or by an etch-back method so that tungsten film 38 and poly-Si film 37 which are made of conductive films remain only in the trenches. Because of this, gate electrodes 20 used for word lines are formed. A condition of dry etching or the like is adjusted so that a position of the top surface of gate electrode 20 will be lower than a position of the top surface of silicon nitride film 31.

Figure 32:
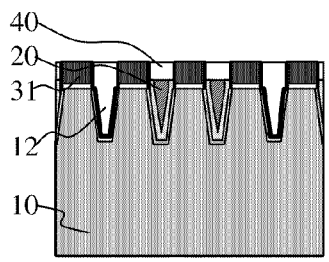
FIG. 32 shows sectional views showing a structure after planarization of layers that exist above the word lines when the DRAM memory cell according to another exemplary embodiment is manufactured.
Figure 32:
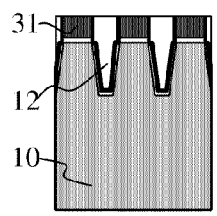
Figure 32:
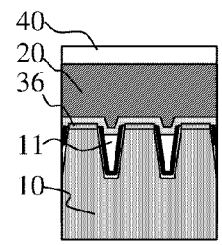
Figure 32:
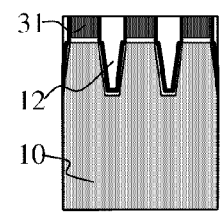

As shown in FIG. 31, interlayer dielectric film 40 is formed by, for example, the CVD method and interlayer dielectric film 40 is abraded by, for example, the CMP method for exposing silicon nitride film 31 as shown in FIG. 32.

Figure 33:
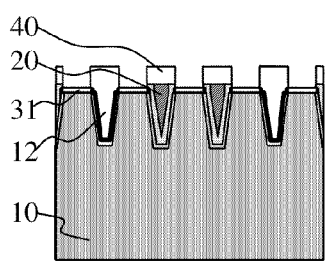
FIG. 33 shows sectional views showing a structure after a removal of a silicon nitride film on diffusion layers when the DRAM memory cell according to another exemplary embodiment is manufactured.
Figure 33:
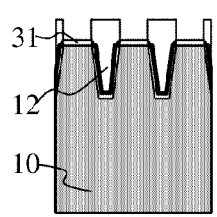
Figure 33:
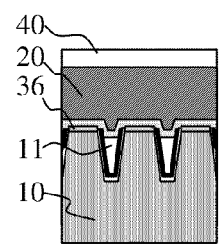
Figure 33:
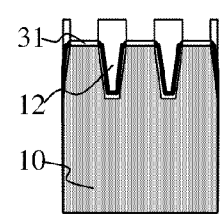

Next, as shown in FIG. 33, exposed silicon nitride film 31 is removed by, for example, wet etching using thermal phosphoric acid.

Figure 34:
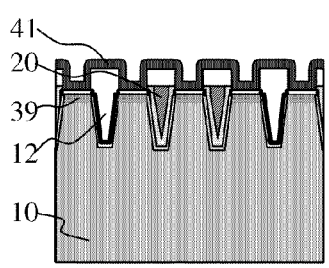
FIG. 34 shows sectional views showing a structure after formation of a silicon nitride film when the DRAM memory cell according to another exemplary embodiment is manufactured.
Figure 34:
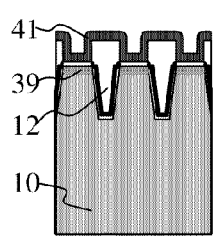
Figure 34:
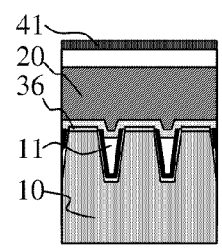
Figure 34:
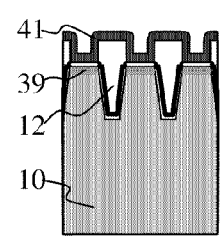

After that, as shown in FIG. 34, for example, by using the CVD method, silicon nitride film 41 is formed with such a film thickness as to not completely bury step portions that are formed in a concave shape by interlayer dielectric film 40.

Figure 35:
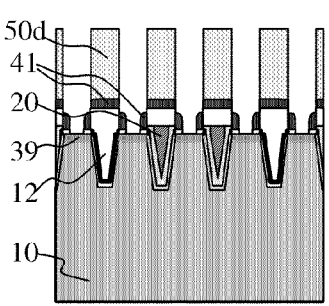
FIG. 35 shows sectional views showing a structure after formation of holes for contact plugs when the DRAM memory cell according to another exemplary embodiment is manufactured.
Figure 35:
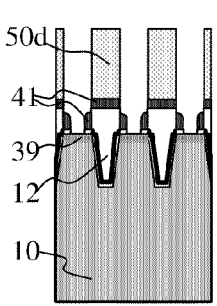
Figure 35:
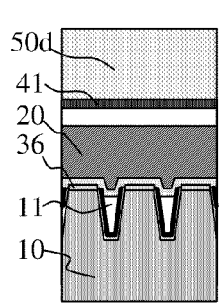
Figure 35:
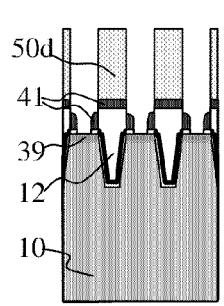

As shown in FIG. 35, holes for forming contact plugs 21 (see FIG. 36) are opened in photoresist film 50d by using the lithography technique after photoresist film 50d is deposited. Silicon nitride film 41 and silicon oxide film 30 except for side walls inside the halls are etched by using an anisotropic dry etching technique. Because of this, the surface of Si substrate 10 is exposed inside the halls. A space between the contact plug and an upper portion of the gate electrode adjacent thereto is always insulated with silicon oxide film 30 and silicon nitride film 41.

Figure 36:
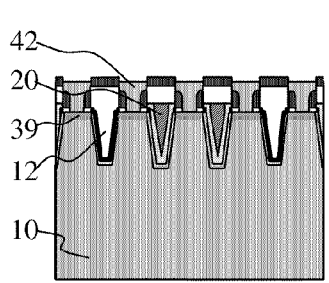
FIG. 36 shows sectional views showing a structure after formation of contact plugs when the DRAM memory cell according to another exemplary embodiment is manufactured.
Figure 36:
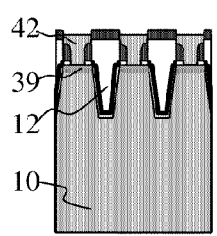
Figure 36:
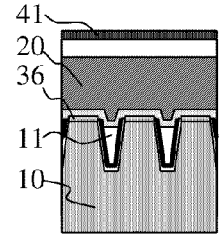
Figure 36:
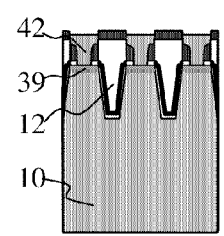

Next, a formation of a poly-Si film by the CVD method and an etch-back process according to the dry etching technique are performed. Because of this, contact plugs 21 for connecting diffusion layers 14 and elements at an upper layer side are formed in the holes of contact patterns 4, as shown in FIG. 36.

It is obvious that impurity implantation and thermal processing that are necessity to form the MOS transistors are appropriately performed, although they are not shown. While steps after the above steps are not shown, similarly to the conventional DRAM, contact plugs 22 for connecting to the storage electrodes, capacitors including the storage electrodes (capacitor pattern 7), bit lines 6, contact plugs 23 for connecting to bit lines 6, and the like are formed so that the DRAM memory cell is completed. A wiring layer is further formed over this memory cell to complete a DRAM.

As the respective exemplary embodiments above described, in the present invention, gate electrodes 20 and the wiring portion connecting between the gate electrodes to each other are implanted in a layer lower than the surface of Si substrate 10 or lower than contact plugs 21 on diffusion layers 14. Because of this configuration, the height of the gate electrode from the substrate surface is suppressed and a cap insulating film, which is necessary in the related art, on the top surface of the gate electrode is not necessary. Additionally, implanting an interlayer dielectric film onto the gate electrodes adjacent to each other does not cause a problem. Moreover, the processability of the contact hole for forming the contact plug on the diffusion layer is improved so that ensuring an insulation margin between the contact plug and the gate electrode becomes easy.

In the present invention, the first trench (device isolation area 12) for separating the diffusion layers that function as source/drain areas is formed on the surface of the Si substrate, while the second trench (device isolation area 11) for separating the channel areas of the MOS transistors adjacent to each other is formed in a layer that is lower than the layer with the first trench. Because of this configuration, the gate electrode and the wiring portion for connecting between the gate electrodes to each other can be formed in the first trench so that it is possible to completely implant the gate electrode into the Si substrate. Accordingly, it is not necessary that a conductive film for the gate electrode connection be separately formed on an upper portion of the trench for the gate electrode which is necessary in the related art, so that a short-circuit failure does not occur at a device isolation portion.

Additionally, in the present invention, the substrate surface is initially etched to form parallel first trench patterns for realizing isolation areas between the diffusion layers and between the channel portions having a double layer structure. Further, the substrate surface in which the first trench patterns have been formed is etched again to form parallel second trench patterns perpendicular to the first trench patterns. Since the first and second trench patterns are formed in a linear shape at this time, the remaining patterns on the substrate surface are only square diffusion layer patterns in a plane view so that a corner portion of a pattern becoming rounded can be suppressed. As a result, the contact area with the contact plug and a margin for alignment error at the time that a contact plug is formed can be sufficiently ensured.

In the respective exemplary embodiments above described, the material, the film thickness or the like to be used can be changed without departing from the spirit of the invention.

The present invention can also be applied to a semiconductor device having MOS transistors sequentially and two-dimensionally arranged with a comparative fine pitch, Accordingly, the present invention can also be applied to a semiconductor device having trench-gate MOS transistors arranged on a semiconductor substrate other than the DRAM memory cell.

It is also possible that the present invention will be applied only to a memory cell portion and a conventionally known planar MOS transistor will be applied to portions other than the memory cell portion.

Although the inventions has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor device, comprising:
    MOS transistors sequentially arranged in a plane direction of a substrate;
    a first device isolation area for separating the diffusion layers that function as a source/drain area of the MOS transistors adjacent to each other on the surface of the substrate; and
    a second device isolation area for separating channel areas of the MOS transistors adjacent to each other in a layer that is lower than a layer that has the first device isolation area,
    wherein a gate electrode and a wiring portion for connecting between the gate electrodes to each other are disposed into a layer lower than a surface of the substrate in which a diffusion layer has been formed.

2. The semiconductor device according to claim 1, further comprising capacitors wherein each of the capacitors is connected to one of the source/drain areas of associated MOS transistors, the capacitor and the MOS transistor functioning as a memory cell.

3. A semiconductor device, comprising:
    a substrate;
    a plurality of MOS transistors each having a gate electrode disposed under a top surface of the substrate;
    a wiring layer for connecting between the gate electrodes, the wiring layer being disposed under the top surface of the substrate, and the wiring layer extending in a first direction;
    a first isolation region formed in the substrate for separating source/drain areas of the MOS transistors adjacent to each other in the first direction; and
    a second isolation region formed in the substrate for separating channel areas of the MOS transistors adjacent to each other in the first direction,
    wherein the second isolation region is disposed under the wiring layer.

4. The semiconductor device according to claim 3, wherein two MOS transistors adjacent to each other in a second direction orthogonal to the first direction share a source/drain area disposed between said two MOS transistors.

5. The semiconductor device according to claim 3, further comprises a third isolation region formed in the substrate for separating source/drain areas of the MOS transistors adjacent to each other in a second direction orthogonal to the first direction.

6. The semiconductor device according to claim 4, further comprising:
    a bit line connected to the source/drain area disposed between said two MOS transistors; and
    two capacitors connected each to one of the other source/drain areas which are not shared by said two MOS transistors.

7. A method for manufacturing a semiconductor device comprising MOS transistors sequentially arranged in a plane direction of a substrate, comprising:
    forming a first device isolation area for separating diffusion layers that function as a source/drain area of the MOS transistors adjacent to each other on a surface of the substrate; and
    forming a second device isolation area for separating channel areas of the MOS transistors adjacent to each other in a layer that is lower than a layer that has the first device isolation area.

8. The method for manufacturing a semiconductor device according to claim 7, wherein, in order to form the first and second device isolation areas, the method comprising:
    forming parallel first trench patterns by etching the surface of the substrate; and
    forming parallel second trench patterns perpendicular to the first trench patterns by etching the substrate surface in which the first trench patterns were formed.

9. The method for manufacturing a semiconductor device according to claim 8, further comprising:
    forming the first and second trench patterns in a linear shape.

10. The method for manufacturing a semiconductor device according to claim 8, further comprises forming gate electrodes and a wiring layer disposed facing to a surface of the first trench patterns with an intervention of a gate insulating film therebetween, wherein the wiring layer connects the gate electrodes to each other.

11. The method for manufacturing a semiconductor device according to claim 8, wherein the second device isolation area is formed by disposing an insulating material at a cross area of the first trench pattern and the second trench pattern.

* * * * *